United States Patent [19]

Graf et al.

[11] 4,107,623

[45] Aug. 15, 1978

[54] PARALLEL ANALOG AND DIGITAL CONTROL LOOPS FOR PHASE LOCKING PRECISION OSCILLATOR TO REFERENCE OSCILLATOR

[75] Inventors: Erhard Graf, Bevaix; Jean-Pierre Wiedmer, Neuchatel, both of Switzerland

[73] Assignee: Oscilloquartz Sa, Neuchatel, Switzerland

[21] Appl. No.: 806,495

[22] Filed: Jun. 14, 1977

[30] Foreign Application Priority Data

Jun. 24, 1976 [CH] Switzerland .................. 8081/76

[51] Int. Cl.² .............................................. H03B 3/04
[52] U.S. Cl. ...................................... 331/1 A; 331/3; 331/11; 331/17; 331/25

[58] Field of Search ................ 331/1 A, 3, 10–12, 331/17, 25

[56] References Cited

U.S. PATENT DOCUMENTS 3,882,412  5/1975  Apple, Jr. .................... 331/10 X

*Primary Examiner*—Siegfried H. Grimm
*Attorney, Agent, or Firm*—Imirie, Smiley & Guay

[57] ABSTRACT

A control device for accurately maintaining the frequency of a quartz crystal oscillator. The control device includes reference oscillators and two control loops in parallel, a first digital control loop providing coarse adjustment of the quartz oscillator frequency and a second, analog control loop providing fine adjustment.

8 Claims, 4 Drawing Figures

PARALLEL ANALOG AND DIGITAL CONTROL LOOPS FOR PHASE LOCKING PRECISION OSCILLATOR TO REFERENCE OSCILLATOR

The present invention concerns a phase control device for an oscillator, particularly a quartz oscillator. Quartz oscillators phase controlled on an extremely stable long term reference frequency and originating from a cesium frequency generator, for example, are used in many spheres, for example, in the sphere of telecommunications and in the sphere of time measurement. In fact, the high quality thermostatic quartz oscillator is now the most stable frequency source available on the market for timing in hundredths of seconds. The slow drift of the frequency (ageing) necessitates recalibration of the frequency of the quartz oscillator periodically. The periods of instability of a cesium frequency generator are shorter than those of a quartz oscillator for times of observation longer than a few hundredths of seconds. The diagram in FIG. 1 represents the principal characteristics of the quartz oscillator and the cesium generator. For times of observation $\tau$ between approximately 1 and 100 seconds, the quartz oscillator, the characteristic of which is shown in mixed lines by the curve Q, has a stability of the order of $10^{-12}$. For times of observation $\tau$ less than approximately 100 seconds, the cesium generator is less stable, a feature which is represented by the curve $E_{cs}$.

FIG. 1 shows that the periods of frequency instability of an atomic generator are shorter than those of the quartz oscillator for times of observation $\tau$ longer than a few hundreds of seconds. Consequently, the control time constant of a quartz oscillator by the reference oscillation of the atomic generator should be of the order of 100 to 500 seconds in order to take advantage of the two reference sources.

Analog control capable of keeping the oscillation of the quartz oscillator in phase with the oscillation of the generator should show a considerable gain in order to be capable of correcting the slow drift of the frequency of the quartz, due to the ageing thereof. However, it is extremely difficult and practically impossible to obtain an analog control loop having at the same time the necessary gain and a time constant of the order of magnitude of a few hundredths of seconds.

On the other hand, a digital control loop does not permit adjustment of the quartz oscillator by steps sufficiently fine for the phase deviation between the oscillation of the quartz oscillator and the oscillation of the generator always to remain within the desired limits. Digital memories having a very high capacity, with outputs of 12 bits for example, permit an adjustment of 4000 steps, which is insufficient to obtain a total range of adjustment sufficient for adjusting the quartz oscillator for years and for obtaining a sufficiently fine adjustment at the same time.

The object of the present invention is to obtain practically continuous control and correction of the slow drift of frequency of the quartz oscillator within a very wide range, whilst optimally combining the characteristics and advantages of the quartz oscillator and the atomic generator.

According to the present invention there is provided a control device in phase with a precision oscillator by a reference oscillator, comprising two control loops connected in parallel, a first loop, digital, comprising a control bi-directional memory counter capable of being set by the phase error signal, the second loop being analog, the sum of the output signals of the said loops simultaneously controlling the phase of the said precision oscillator.

By combining the effect of two control loops, optimal control conditions are obtained. The digital loop makes it possible to control the slow drift of the frequency of the quartz oscillator by relatively coarse steps and within a very wide range, whilst the analog loop makes it possible to effect fine control adjustment between the steps of the digital control loop. In the event of a defect in the generator, the memory counter of the digital loop memorises the frequency of the quartz oscillator at the value achieved so that this oscillation continues to oscillate at the correct frequency. Such memorising of a correction value acting on the quartz oscillator would be impossible with pure analog control. However, as the analog loop requires only a gain sufficient to effect the fine adjustment between two steps of the digital loop, it is possible to obtain an analog loop, the time constant of which is sufficiently long to profit optimally from the advantages and characteristics of both frequency sources. The gain of the analog control loop may be modified, thus making it possible to adjust the memory counter of the digital loop during a relatively short starting phase after which the gain in the analog loop is reduced to a value at which a time constant of the desired magnitude is easily obtained.

The present invention will now be described by way of example, with reference to the accompanying drawings, in which:

FIG. 1 is a diagram representing the stability of both frequency sources in question, as a function of the time of observation hereinbefore referred to;

Figure 2:
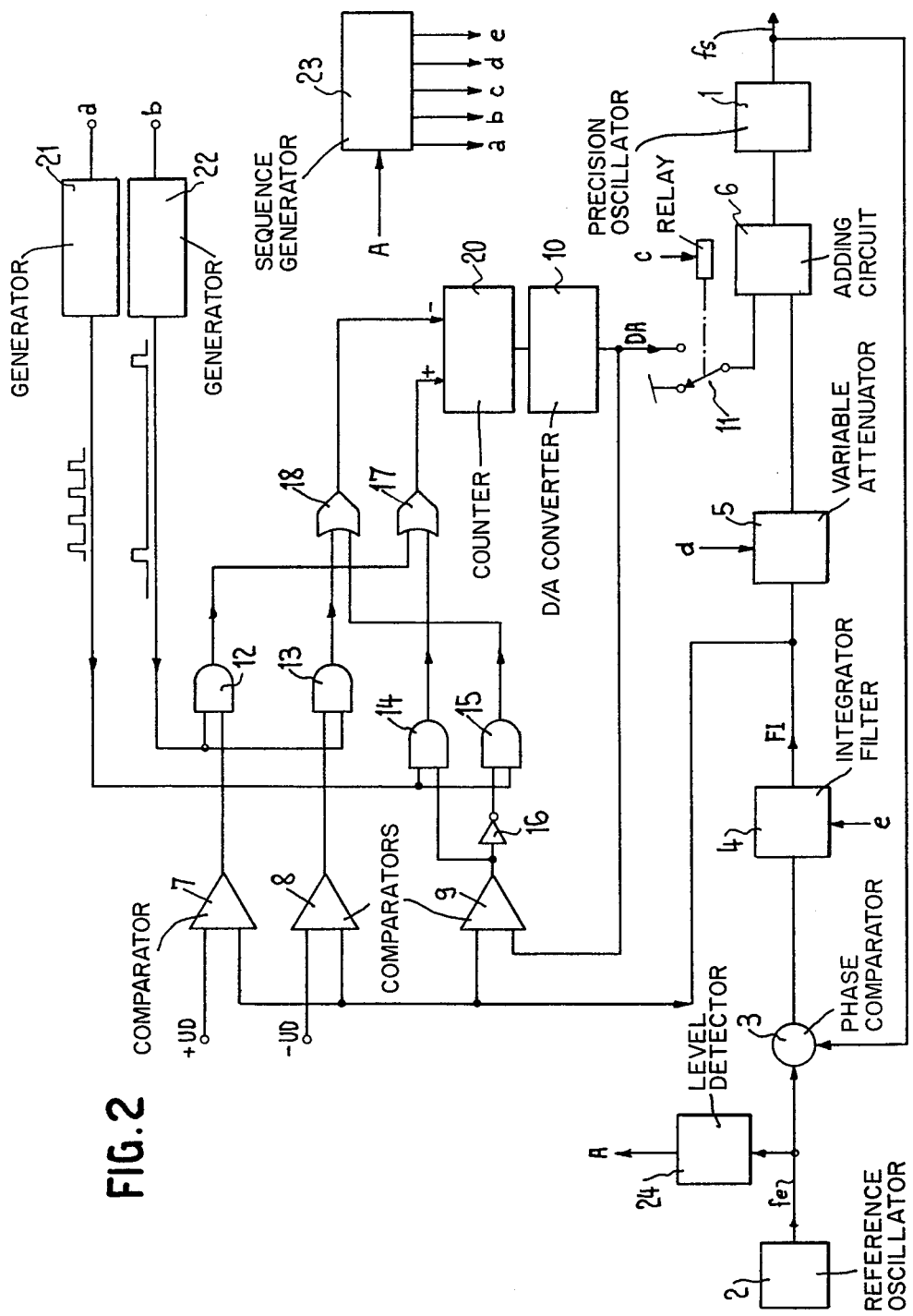
FIG. 2 is a diagram of a first embodiment of the control device.

The device shown in FIG. 2 comprises a quartz oscillator 1, the output frequency $f_s$ of which is transmitted to a system (not shown). The quartz oscillator is controlled by a cesium generator 2 which furnishes a standard oscillation at a standard frequency $f_e$. The frequencies $f_e$ and $f_s$ are transmitted to the inputs of a phase comparator 3, the output of which is transmitted to an integrator filter 4, the output of this integrator filter 4 being connected to the input of an attenuator 5 having two levels. In a first state, the output of the attenuator is at a level 1, and in a second state, of the order of 1/100. The output signal of the attenuator 5 is transmitted to one of the inputs of an adding member 6, the output of which is connected to the correction input of the quartz oscillator 1.

The output of the integrator filter 4 is connected to an input of each of three voltage comparators 7, 8 and 9. The inputs of the comparators 7 and 8 are supplied with input voltages of the same value but of opposed polarity +UD and −UD, respectively. The other input of the comparator 9 is connected to the output of a digital-analog or numerical analog converter 10. A switch 11 makes it possible to connect the second input of the adding member 6 either to an input voltage for example, earth, or to the output of the converter 10.

The outputs of the comparators 7–9 are respectively connected to one of the inputs of gates 12, 13 or 14 and an inverter 16 is connected between the voltage comparator 9 and a gate 15. The outputs of the gates 12 and 14, and of the gates 13 and 15, respectively, are connected to the inputs of an OR gate 17, and an OR gate 18, respectively. The output of the gate 17 is connected to the addition input (+) of the up-down counter 20, whilst the output of the gate 18 is connected to the subtraction input (−) of this counter 20. The gates 14 and 15 are controlled by a correction frequency generator 21, whilst the gates 12 and 13 are controlled by a correction frequency generator 22. The frequency of the generator 21 is higher than that of the generator 22, as indicated by the pulses on the output lines of these generators.

The circuit comprises a correction sequence generator 23 which controls the sequence of operations especially during the starting phase of the control device. A level detector 24 supplies an output signal A during the absence of the standard signal of frequency $f_e$. This signal A makes it possible to control the generator 23 and blocks any operation which could modify the correction signal transmitted to the quartz oscillator 1.

Figure 1:
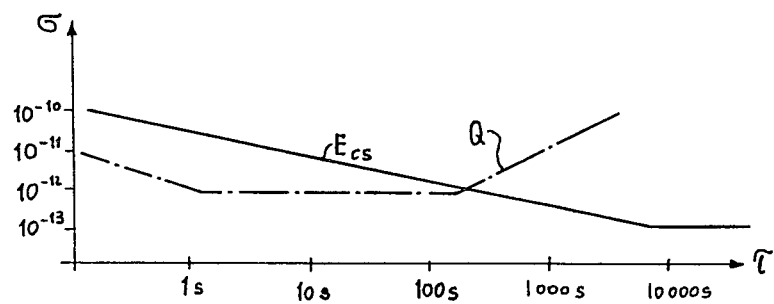
Figure 3:
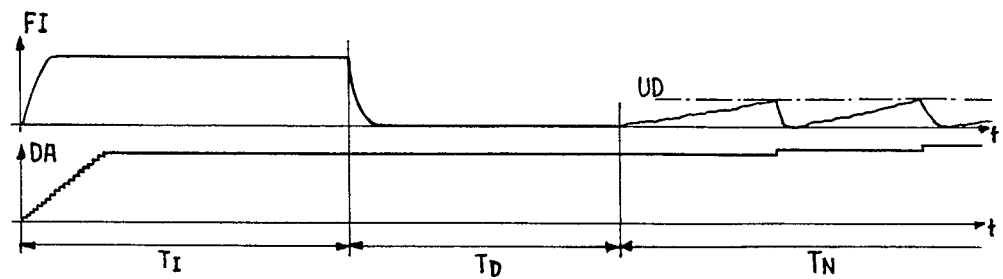
FIG. 3 is a diagram explaining the operation of the device according to FIG. 2.

The control device is shown in its starting state in which the switch 11 connects one of the inputs of the adder calculator 6 to the input potential 0. The generator 21 is actuated by the output $a$ of the sequence generator 23. A series of pulses is thus transmitted to the gates 14 and 15. The standard frequency and the output frequency of the quartz oscillator are transmitted to the phase comparator 3. According to the sign and the phase difference between these frequencies, the comparator 3 produces a positive or negative output signal which depends on the phase differences. The output signal of the comparator 3 is integrated in the integrator filter 4, the output signal of which is transmitted to the voltage comparator 9. Assuming that the counter 20 is in an intermediate state, i.e. it memorises a number of steps which correspond approximately to half the total capacity of the counter. The converter 10 supplies an output signal which corresponds to approximately half the maximum correction voltage which can be produced by the converter. This output voltage DA is compared in the voltage comparator 9 with the output voltage FI of the integrator filter 4. According to the sign of the difference in the two voltages, the comparator 9 produces a positive or negative output signal. When this signal is positive, the gate 14 allows each pulse originating from the generator 21 to pass to the gate 17 which transmits this signal to the addition input of the counter 20. Extra additive pulses are then similarly transmitted until the number held in the counter 20 is such that the output voltage DA of the converter 10 is equal to the voltage FI. This operation is shown in FIG. 3 in which an increase of the voltage FI to a specific value is seen, whilst the output voltage of the converter 10 increases stepwise to the same value. During this starting time which is indicated in FIG. 3 by the time $T_I$, the output voltage FI is transmitted by the attenuator 5 to the adding member 6 and to the correction input of the quartz oscillator 1. This correction voltage corresponds to the voltage necessary for correcting the frequency of the quartz exactly to the standard frequency and to keep the oscillation of the oscillator 1 in phase with the oscillation of the standard source 2. At the end of the starting phase $T_I$, the generator 21 is stopped and practically at the same time, the outputs $b$, $c$ and $d$ of the sequence generator 23 are actuated so that the generator 22 is connected and the switch 11 is changed-over so that the output of the converter 10 with the voltage DA is transmitted to the adder 6. After reversing the switch 11, the correction voltage of the oscillator 1 being the sum of the voltages DA and FI, the analog loop returns the voltage FI to a value close to zero. The correction effect thus remains the same and the quartz oscillator 1 continues to oscillate at the desired frequency, in phase with the standard signal coming from the standard generator 2. The voltage comparators 7 and 8 produce output signals of a value "0" and no correction is effected. This state is shown in FIG. 3 by the time $T_D$. The length of this interval $T_D$ is determined by the sequence generator 23 and is of the order of a few seconds. The normal operating state TN begins with the reduction of the analog gain by means of the attenuator 5, output $d$ of the sequence generator 23, and the actuation of the generator 22 controlled by the output $b$ of the generator 23. Control is then effected with a long time constant. Because of the slow drift of the frequency of the quartz oscillator, due to the ageing of the quartz, a difference in frequency and phase is subsequently produced, which difference is translated by an output voltage rising to the output of the integrator filter 4. When this output reaches the level UD, the comparator 7 or comparator 8, according to the sign of the voltage FI, produces a signal which allows a pulse from the generator 22 to be transmitted via one of the gates 12 or 13, and one of the gates 17 or 18, to one of the inputs of the counter 20. This counter and, consequently, the output signal DA of the converter 10 is thus modified. At the same time the integrator filter 4 is returned to zero. The same operations are repeated as shown in FIG. 3 during the period $T_N$ of normal operation. This figure shows that the output voltage DA is corrected, for example, increased or diminished in steps. Between these steps a fine adjustment of the quartz oscillator is effected by the analog loop in which 1/100 approximately of the voltage FI is transmitted by the attenuator 5 and the adding device 6 to the quartz oscillator. This oscillator is therefore constantly subjected to a fine adjustment. The steps of the voltage DA are for example of the order of 2.5 millivolts. For 4000 steps of the counter 20, a range of adjustment of approximately 10 volts is obtained.

The considerable attenuation of the output signal of the integrator filter 4 offers special advantages. Due to this attenuation, the time constant of the analog loop is very high, i.e. the special features of both frequency sources are optimally utilised. Moreover, measurement by the comparators 7 to 9 may be effected at a voltage level of 250 millivolts, for example.

When the capacity of the counter 20 is almost reached, the trimmer of the quartz is adjusted in the desired direction and the control device is returned to its starting condition shown in the drawings. The memory counter 20 is readjusted to a suitable value which may be at half the total capacity of the counter. When the direction of the systematic frequency drift of the quartz oscillator is known, a starting condition of the counter 20 may also be selected enabling a considerable correction to be made in the necessary direction.

In the absence of the standard signal $f_e$, the level detector 24 transmits a signal A to the sequence generator 23 by which the outputs $a$ and $b$ are blocked so that the generators 21 and 22 are stopped. Thus no correction is made and the memory counter 20, associated with the converter 10, memorises the last correction voltage necessary for the oscillator.

Figure 4:
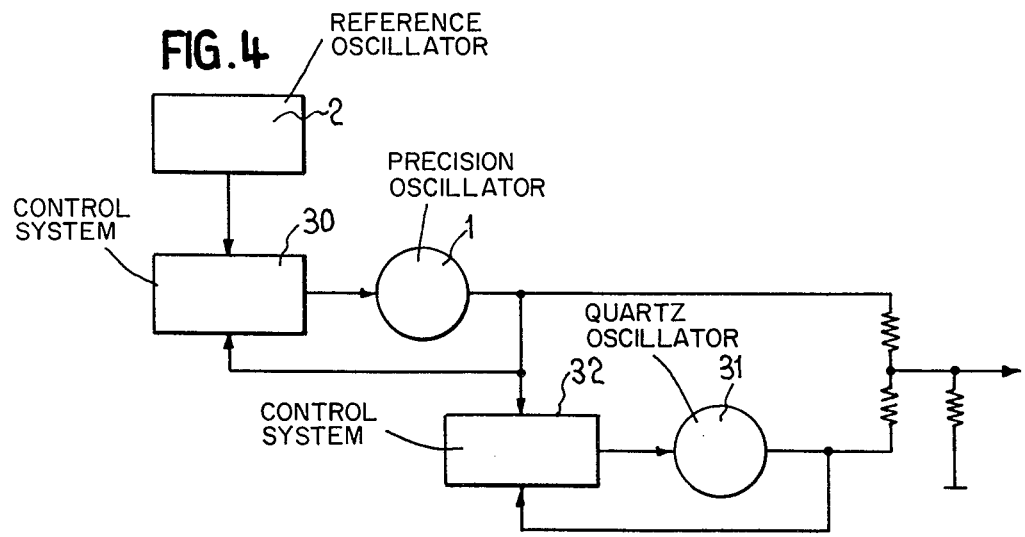
FIG. 4 is a block diagram of a second embodiment.

A frequency generation system of high output may be achieved by means of two quartz oscillators, the second being controlled in phase with the first which is itself controlled on the cesium generator phase. A system of this type is shown in FIG. 4, in which the quartz oscillator 1 is shown together with the cesium generator 2 which corresponds to the components 1 and 2 shown in FIG. 2. The control system 30 corresponds to the system shown in FIG. 2. The second quartz oscillator 31 is controlled to the phase of the first quartz oscillator by means of a control system 32 which corresponds to a control system such as shown in FIG. 2. The outputs of the two quartz oscillators are only added together vectorially by passive elements, a feature which is possible due to the zero or minimum phase difference between them. During the absence of the standard frequency, the oscillators continue to be in phase and their frequencies correspond, at the moment of interruption of the standard oscillation $f_e$, to the last correction of the digital part of the control of the first quartz oscillator. In the absence of the signal from the quartz oscillator 1, the second quartz oscillator 31 continues to operate in the same manner on the last connection. Such a system is very reliable and has a stability produced by the quartz oscillators and the cesium generator.

The switching of the circuits shown in FIG. 2 at the end of the starting phase $T_I$ may be effected manually, but it is normally controlled automatically. The switches may be triggered by a timing mechanism (not shown) adjusted to a fixed time during which the starting phase is terminated, i.e. the memory counter 20 adjusted, or the switching may be triggered when the voltage at the output of the comparator 9 oscillates between 0 and 1 during the starting phase, thus indicating that the voltages DA and FI have approximately the same value at the resolution of the converter 10.

We claim:

1. A device for phase control of a precision oscillator by a reference oscillator, comprising a phase detector connected to said oscillators, two control loops connected in parallel to the output of said phase detector, a first of said loops being digital and comprising a control bi-directional memory counter capable of being set by a phase error signal from said phase detector, and a second of said loops being analog and including an adjustable variable-gain circuit, and an adding circuit for forming the sum of the output signals of the said loops for simultaneously controlling the phase of the said precision oscillator.

2. A device according to claim 1, having a starting state with high gain of said variable-gain circuit and a normal operating state with low gain of said variable-gain circuit, and switch means for switching over from one of said states to the other.

3. A device according to claim 2, comprising means for automatical switching over from one of said states to the other.

4. A device according to claim 1, wherein said digital loop comprises comparators in which the phase error signal from said phase comparator is compared to at least one reference voltage.

5. A device according to claim 4, comprising a first comparator operable during said starting state, inputs of said first comparator being controllable by the output of a digital-analog converter at the output of said digital loop and said error signal respectively, a pair of further comparators operable during said normal operating state and controllable each by said error signal and by reference voltages of the same value but of opposed polarity respectively.

6. A device according to claim 5, wherein said digital loop has a bi-directional memory counter connected to said digital-analog converter and having an adding input and a substracting input, operable both from said comparators, said first comparator being connectable only to the adding input of said memory counter in order to increase its count during said starting state until the output signal of said digital-analog converter is equal to the error signal.

7. A device according to claim 1, in which the variable-gain circuit is an amplifier of which the gain is greater than or equal to 1 in the starting state and less than unity in the normal operating state.

8. A device according to claim 1, in which a ratio of at least 10 exists between the gain of the said variable-gain circuit in its starting state and its normal operating state.

* * * * *